United States Patent [19]

Senderowicz et al.

[11] Patent Number: 4,920,510
[45] Date of Patent: Apr. 24, 1990

[54] SAMPLE DATA BAND-PASS FILTER DEVICE

[75] Inventors: Daniel Senderowicz, Berkeley, Calif.; Guido Torelli, South Alessio; Germano Nicollini, Piacenza, both of Italy

[73] Assignee: SGS Microelectronica SpA, Cantania, Italy

[21] Appl. No.: 63,258

[22] Filed: Jun. 17, 1987

[30] Foreign Application Priority Data

Jun. 20, 1986 [IT] Italy .............................. 20876 A/86

[51] Int. Cl.$^5$ ........................ G06G 7/02; H03H 19/00
[52] U.S. Cl. ................................... 364/825; 307/490; 328/151; 333/173
[58] Field of Search ............... 364/825, 724.19, 724.13, 364/724.16, 606; 333/173, 172, 168, 166, 165; 330/109, 167, 107; 328/167, 151; 307/520, 521, 352, 353, 490

[56] References Cited

U.S. PATENT DOCUMENTS

| | | | |
|---|---|---|---|
| 4,315,227 | 2/1982 | Fleischer et al. | 333/173 |
| 4,322,697 | 3/1982 | Carbrey | 333/173 |
| 4,333,064 | 6/1982 | Kato et al. | 333/173 |
| 4,498,063 | 2/1985 | Makabe et al. | 333/173 |
| 4,763,088 | 8/1988 | Negahban-Hagh | 333/173 |

OTHER PUBLICATIONS

Tsividis–"Design of MOS VLSI Circuits for Telecommunications", p. 304, Date & Publisher unknown.
Allstot et al.–"MOS Switched Capacitor Ladder Filters", IEEE Journal of Solid State Circuits, vol. SC-13, No. 6, Dec. 1978-pp. 806-814.

Primary Examiner—Joseph Ruggiero
Attorney, Agent, or Firm—Wolf, Greenfield & Sacks

[57] ABSTRACT

The sampled-data band-pass filter device is based on the phenomemon of aliasing, and allows the substantially unattenuated passage of the components of an input signal at a frequency included within an interval comprised between a first frequency ($f_{sL}$) and a second frequency ($f_{sH}$), arranged around a third frequency ($f_{sO}$), while it substantially attenuates the components of the input signal at frequencies outside said interval, and furthermore automatically performs the shift to low-frequency, around a fourth frequency ($f_O$), of the components of the input signal which have passed without attenuation. According to the invention, the device comprises, as filter element, a sampled-data band-pass filter which employs, as sampling frequency, a fifth frequency ($f_s$) equal to a whole submultiple of a sixth frequency ($nf_s$) equal to the sum of the third frequency ($f_{sO}$) and the fourth frequency ($f_O$), having, as lower and upper cutoff frequencies, respectively the difference between the sixth frequency and the second frequency ($nf_s - f_{sH}$) and the difference between the sixth frequency and the first frequency ($nf_s - f_{sL}$).

5 Claims, 4 Drawing Sheets

SAMPLE DATA BAND-PASS FILTER DEVICE

BACKGROUND OF THE INVENTION

The present invention relates to a sampled-data band-pass filter device, particularly adapted to be included in signal processing systems.

Usually, in order to perform band-pass filtering, "time-continuous" filters, of the passive type provided by means of capacitors, inductors and resistors, or of the active type provided by means of operational amplifiers, resistors and capacitors, are employed.

A per se known alternative method employs the so-called "sampled-data" technique; the signal to be filtered is first sampled and then subjected to the filtering process. Filters operating according to this method are known as "sampled-data filters". The literature provides a vast documentation on the problems related to the sampling of a signal and to its processing with the sampled-data method (e.g. "Digital Signal Processing", by A. V. Oppenheim and R. W. Schafer, Prentice-Hall, Inc., Englewood Cliffs, N.J., U.S.A., 1975).

An essential advantage provided by sampled-data filters resides in the fact that they allow a very accurate filtering action. Filtering specifications can in fact be provided with remarkable precision and in a manner substantially independent from environmental and/or operating conditions.

Moreover, such filters are very adaptable for monolithic integration.

A known phenomenon related to the sampling process is that it introduces in the spectrum of the signal some components which are the shifts of the spectral components of the original signal around the whole multiples of the sampling frequency. If $M(\omega)$ is the spectrum of a time-continuous signal $m(t)$, the spectrum $M_s(\omega)$ of the signal obtained by ideally sampling $m(t)$ with a succession of pulses having an infinitesimal duration ("Dirac's delta") arranged at a distance $T_s$ from one another is given by:

$$M_s(\omega) = \sum_{n=-\infty}^{+\infty} M(\omega - n\omega_s) \quad (1)$$

where $\omega_s = 2\pi/T_s = 2\pi f_s$ is the angular sampling frequency.

Actually, since the sampling process is not ideal, the spectral components are increasingly attenuated as $\omega$ increases, by the so-called "sin (x)/x factor". The real spectrum of the sampled signal $M_{es}(\omega)$ is given by:

$$M_{es}(\omega) = \sum_{n=-\infty}^{+\infty} M(\omega - n\omega_s) \frac{\sin(\omega T_s/2)}{\omega T_s/2} \quad (2)$$

If in the time-continuous signal $m(t)$ there exist components of appreciable value at a frequency higher than $f_s/2$, in the spectrum of the sampled signal there may thus appear, in the frequency interval $0 - f_s/2$ (called "base band"), additional components with respect to those present, in said band, in the signal $m(t)$. This phenomenon, known as "aliasing", makes impossible a correct "reconstruction" of the signal $m(t)$ starting from the sampled signal (typically this is achieved by simple time-continuous low-pass filtering, which cuts the components at a frequency higher than $f_s/2$).

The disadvantage of aliasing generally leads to the provision of a low-pass time-continuous filtering ("antialiasing") before the sampling, with the aim of eliminating all the unwanted components possibly present in $m(t)$ at a frequency higher than $f_s/2$. In order to avoid the need to have the antialiasing filter be very selective, and thus expensive, it is convenient that the components of actual interest of the signal $m(t)$ be all at frequencies much lower than $f_s/2$.

Though in most cases aliasing is a disadvantage, as will be described hereinafter, it is used as the fundamental principle of the invention described herein.

To provide an effective sampled-data processing device it is thus convenient to use, according to the prior art, a sampling frequency much higher than the signal's maximum frequency of interest. If it is required to perform a filtering on a high-frequency signal (e.g. a few MHz), it is necessary to use a very high sampling frequency (typically, in the example given, a few tens of MHz), which can be particularly difficult, expensive, or in some cases, for example when the filtering system is to be included in a monolithic integrated circuit provided with methods not allowing very high speeds, even impossible.

In some processing systems (e.g., in many reception systems) the signal is often shifted to a lower frequency range in order to simplify processing, in particular the filtering operations (in fact, it is easier to provide a low-frequency selective filter than a high-frequency one). A typical example is given by a "superheterodyne" receiver, wherein the frequency shift if achieved by means of a beat circuit, with which the signal to be processed is multiplied with a signal of adapted frequency (see e.g. H. Taub, D. L. Schilling: "Principles of Communications Systems", McGraw-Hill, Inc., New York, 1971, page 268 onwards). The addition of the circuit blocks required to perform this frequency shift logically entails a greater complexity and a greater overall cost of the system.

SUMMARY OF THE INVENTION

The aim of the present invention is to provide a sampled-data device which performs the band-pass filtering of a signal and its automatic shift to a lower frequency range, having, performance being equal, less stringent selectivity requirements with respect to filters operating according to the prior art, said device using a sampling signal having a frequency not necessarily much higher than the maximum frequency at which there are components of appreciable value in the signal to be filtered.

The invention achieves said main aim, together with other objects and advantages as will become apparent hereinafter, with a sampled-data band-pass filter device based on the phenomenon of aliasing, which allows the substantially unattenuated passage of the components of an input signal at a frequency included within an interval comprised between a first frequency and a second frequency, said first and second frequencies being arranged around a third frequency, and substantially attenuates the components of the input signal at frequencies outside said interval, and furthermore automatically performs the low-frequency shift around a fourth frequency of the components of the input signal which have passed without attenuation, characterized in that it comprises, as filter element, a sampled-data band-pass filter which employs, as sampling frequency, a fifth frequency equal to a whole submultiple of a sixth frequency equal to the sum of the third frequency and the fourth frequency, and having, as lower and upper cutoff frequencies, respectively the difference between the sixth frequency and the second frequency and the difference between the sixth frequency and the first frequency.

BRIEF DESCRIPTION OF THE DRAWINGS

A preferred embodiment of the invention is now described, given only by way of non-limitative example with reference to the accompanying drawings, where.

DESCRIPTION OF THE PREFERRED EMBODIMENTS

Figure 1:
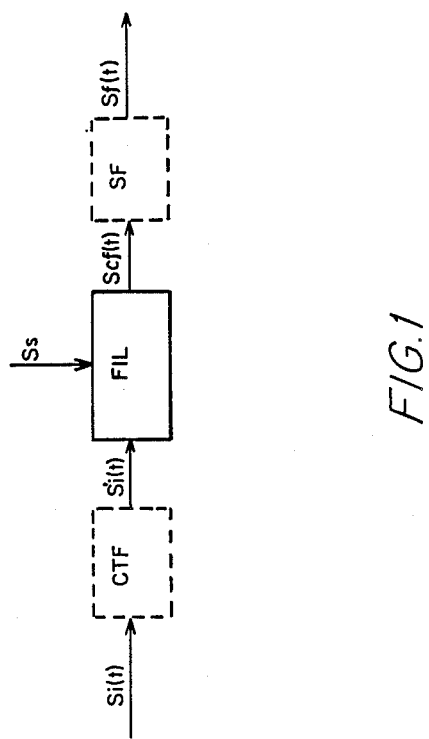
FIG. 1 is a block diagram of a filter device according to the invention.

With reference to FIG. 1, $s_i(t)$ is the signal (presumed to be time-continuous) which must be subjected to the band-pass filtering operation, the block FIL indicates a sampled-data filter, with the characteristics described hereinafter, $s_{cf}(t)$ is the signal, time-sampled, filtered and frequency-shifted as required, and s is the sampling signal used by the filter, having frequency $f_s$. SF indicates the smoothing filter required if a time-continuous signal ($s_f(t)$) is required at the output to the system. As will be described hereinafter, in order to appropriately limit the spectrum of the signal entering the block FIL, indicated in FIG. 1 by $s'_i(t)$, it is often necessary to place a time-continuous filter block, indicated in FIG. 1 by the block CTF, between the signal $s_i(t)$ and the input to the block FIL.

Figure 2:
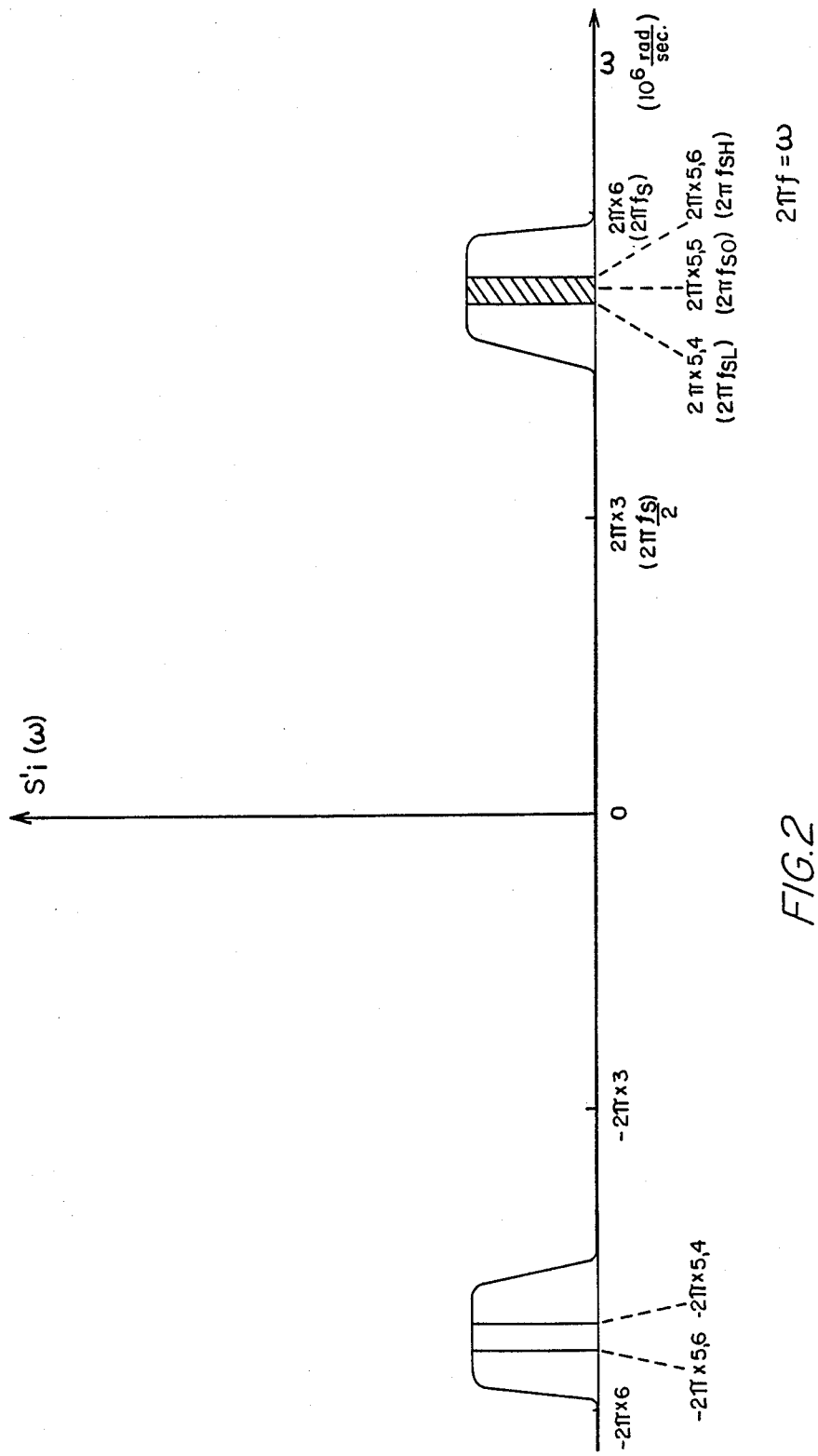
FIG. 2 is a graph of the spectrum of a signal to be filtered with the device according to the invention.

FIG. 2 illustrates, by way of example, the spectrum $S'_i(\omega)$ of a signal $s'_i(t)$ which must be subject to filtering according to the method of the invention. The signal $s'_i(t)$ is supposed limited upwardly in frequency, i.e. below 6 MHz. The components which must pass without attenuation through the filter system are those at frequencies comprised between 5.4 and 5.6 MHz (indicated by the shaded portions in FIG. 2). The part of the signal which must not be attenuated has a "central" frequency equal to 5.5 MHz and a bandwidth of 200 kHz. The two limit frequencies of the band of interest are $f_{sL} = 5.4$ MHz and $f_{sH} = 5.6$ MHz. A signal of this type is, for example, the signal of the first intermediate acoustic frequency (right channel+left channel in the case of stereophonic transmission) present in the TV signal transmitted according to the so-called German 2-Carrier standard (see U. Buhse: "The German 2-Carrier System for Terrestrial TV-Sound Transmission Systems and Integrated Circuits for 'High-Quality' TV-Receivers", IEEE Transactions on Consumer Electronics, vol. CE-28, no. 4, November 1982, pages 489–503). In FIG. 2 it has been supposed that the components of the signal $s'_i(t)$ at a frequency lower than = 3-4 Mhz have been attenuated beforehand (for example by means of the filter CTF of FIG. 1).

The frequency of 6 MHz (which is approximately equal to the value of the maximum frequency at which there are signal components with appreciable values) is now taken as sampling frequency $f_s$ for the filter FIL.

The filter FIL is a band-pass filter having as cutoff frequencies $f_{TL} = f_s - f_{sH} = 400$ kHz and $f_{TH} = f_s - f_{sL} = 600$ kHz. Thus:

$$f_s = f_O + f_{sO} \quad (3)$$

where $f_O$ is the central frequency of the filter, equal to 500 kHz.

The block FIL can be ideally divided in two sub-blocks. The first sub-block performs the sampling of the input signal $s'_i(t)$, while the second sub-block performs the actual filtering on the output signal of the first sub-block.

The sampling performed on the signal $s'_i(t)$ introduces in the signal's spectrum some components at frequencies different from the original ones. Concentrating on the low frequencies, and neglecting what occurs around the multiples of the sampling frequency $f_s$ (that is, considering only the terms of the summation in which $n=0,+1,-1$ in equation (1)), the spectrum $s'_{ic}(\omega)$ of the sampled signal, supposing an ideal sampling, is:

$$S'_{ic}(\omega) = S'_i(\omega) + S'_i(\omega - \omega_s) + S'_i(\omega + \omega_i s) \quad (4)$$

Figure 3:
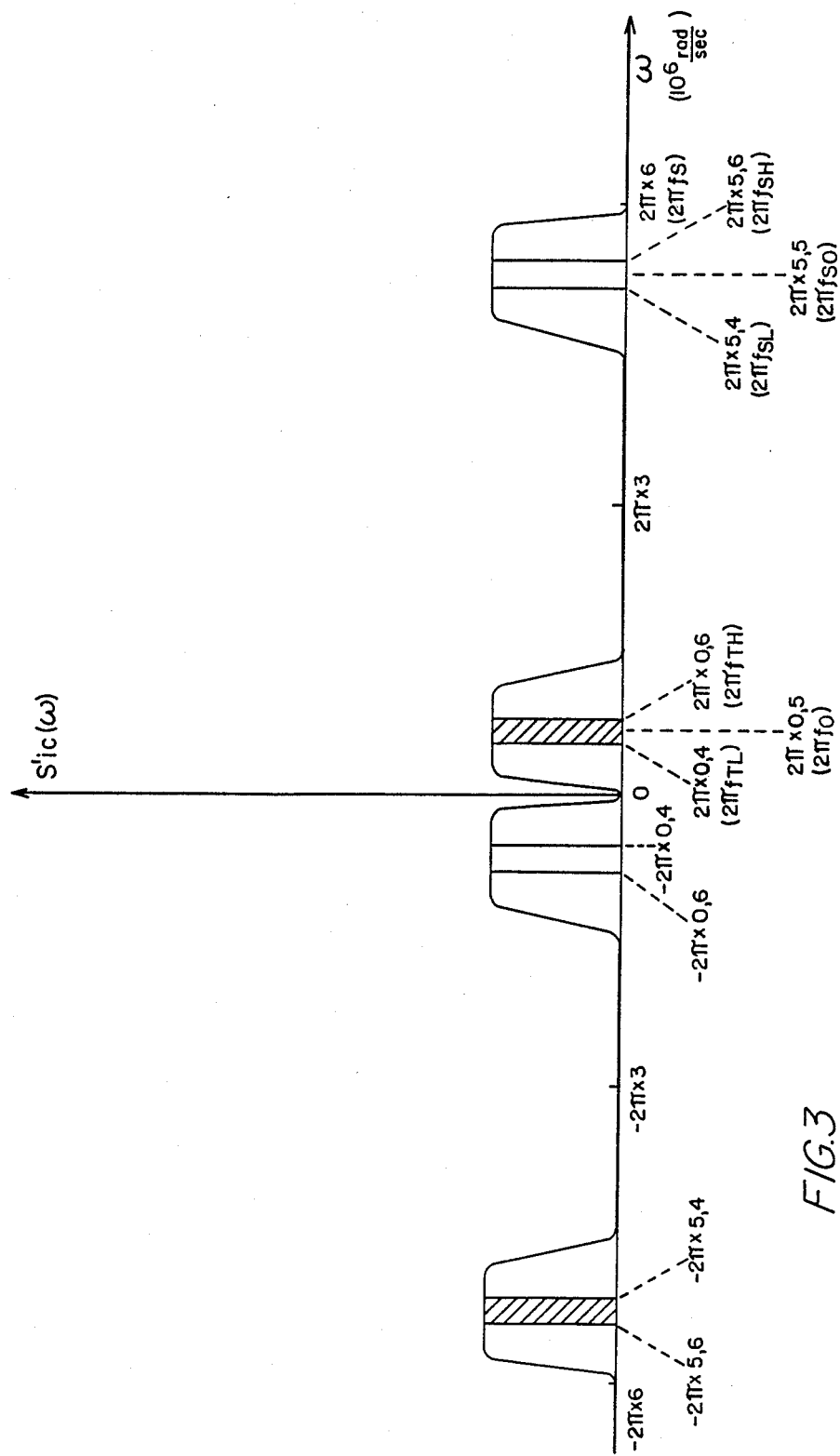
FIG. 3 is a graph of the spectrum of the signal obtained by sampling the signal of FIG. 2.

The spectrum $S'_{ic}(\omega)$ between the frequencies $-f_s$ and $f_s$ (that is, between $-6$ Mhz and 6 Mhz) is thus as illustrated in FIG. 3. At low frequency there is a spectral component equal and symmetrical, with respect to $f_s/2$ ($=3$ Mhz), to the spectrum of the time-continuous input signal $S'_i(\omega)$.

In the spectrum $S'_i(\omega)$, the components of interest of the input signal $s_i(t)$ are also in the band comprised between $f_s - f_{sH}$ and $f_s - f_{sL}$ (400–600 kHz), again indicated by shading in FIG. 3. The second sub-block in which the sampled-data filter FIL has been ideally divided performs a band-pass filtering with cutoff frequencies equal to $f_s - f_{sH}$ and $f_s - f_{sL}$. It thus allows the passage without attenuation of exactly those spectral components which correspond to the components of the signal $s_i(t)$ which it is desired to allow to pass. The other spectral components are instead attenuated as required. It should be noted that the components between 400 and 600 kHz, due to the low value of $\omega T_s/2$, are scarcely affected by the attenuation factor sin (x)/x. If necessary, it is possible to also take this effect into account by altering the frequency response of the filter FIL with methods known to the expert in the field.

The operation of the device is certainly correct if the signal $s'_i(t)$ contains no spectral components of appreciable amplitude at frequencies below $f_s/2$, as supposed in FIG. 2: thus, in fact, there is no overlapping, even partial, between the base-band shifted spectrum and the original spectrum. If there is no certainty that the spectrum of the signal $s_i(t)$ is downwardly limited in frequency to the value $f_s/2$, it is necessary to place before the block FIL a time-continuous high-pass filter which ensures such a limitation (the filter CTF of FIG. 1). If there is a similar problem at high frequencies (that is, if the spectrum $S_i(\omega)$ is not upwardly limited below $f_s$) it is convenient to arrange, before the block FIL, also a low-pass filter, to achieve such a limitation. If both the low-pass filter and the high-pass filter are necessary, the filter CTF is a band-pass filter.

In order to ensure the correct operation of the device, it is sufficient that the spectrum of the input signal of the sampled-data filter FIL be downwardly limited to the frequency $f_{TH}$ (600 kHz in the case of the example). The embodiment of the high-pass filter CTF is therefore simple, since it does not require high selectivity. A similar reasoning is valid for the low-pass filter possibly required to limit at high frequencies the spectrum of the input signal $s'_i(t)$. The selectivity required of this filter depends on the distance between $f_{sH}$ and $f_s$, which can generally be selected conveniently also with the purpose of simplifying the embodiment of this filter.

The filter device described is particularly simple, since it does not require a very high sampling frequency with respect to the maximum frequency of interest of the signal subject to processing.

An extremely important advantage resides in the fact that the sampled-data filter FIL has, performance being equal, less stringent selectivity requirements than a filter actually operating at high frequencies according to the prior art. Indeed, supposing, for example that the filter must substantially attenuate all the components at frequencies below 5.36 MHz and those at frequencies above 5.64 MHz. The response of a filter operating a high frequency must pass from a virtually nil attenuation in the pass-band to the minimum attenuation required outside the band (e.g. 45 dB) in an interval of 40 kHz, which represents less than 1% of the upper cutoff frequency of the filter. Instead, by providing the filter system according to the invention, the above said frequency interval, which is still equal to 40 kHz, represents approximately 7% of the upper cutoff frequency of the filter, which is thus simpler to design and cheaper.

Another advantage is that the single block FIL provides, as well as the band-pass filtering, also the shift of the spectral components of the filtered signal to lower frequencies, where a subsequent processing of the signal is simpler, and a further circuit block is therefore not required to perform this shift.

The manufacture of the device described is obvious for the expert in the field, according to the above indications, and its description is therefore omitted. In particular, a particularly effective implementation of the device described herein is the one in which the filter FIL is provided by employing the switched-capacitor method (see e.g. "Proceedings of the IEEE", Issue of August 1983).

The case up to now illustrated, in which the sampling frequency $f_s$ is higher than the maximum frequency of interest of the signal to be subjected to filtering, is particularly simple from the explanatory point of view.

In other embodiments the sampling frequency $f_s$ can even be lower than the lower cutoff frequency $f_{sL}$ of the band of interest of the signal $s_i(t)$.

Still with reference to an input signal $s'_i(t)$ the spectrum whereof, possibly after treatment by means of a suitable time-continuous filter block CTF, is the one illustrated in FIG. 2, the sampling frequency $f_s$ for the sampled-data filter FIL is supposed equal to 3 MHz. The cutoff frequencies of the filter FIL are $f_{TL}=2f_s-f_{sH}=400$ kHz and $f_{TH}=2f_s-F_{sL}=600$ kHz. The central frequency of the filter, $f_0$, equal to 500 kHz, is such that:

$$2f_s = f_0 + f_{sO} \tag{5}$$

As in the previous case, the block FIL is ideally divided into two sub-blocks, the first one whereof performs the sampling of the input signal $s'_i(t)$ and the second performs the actual filtering on the sampled signal.

Figure 4:
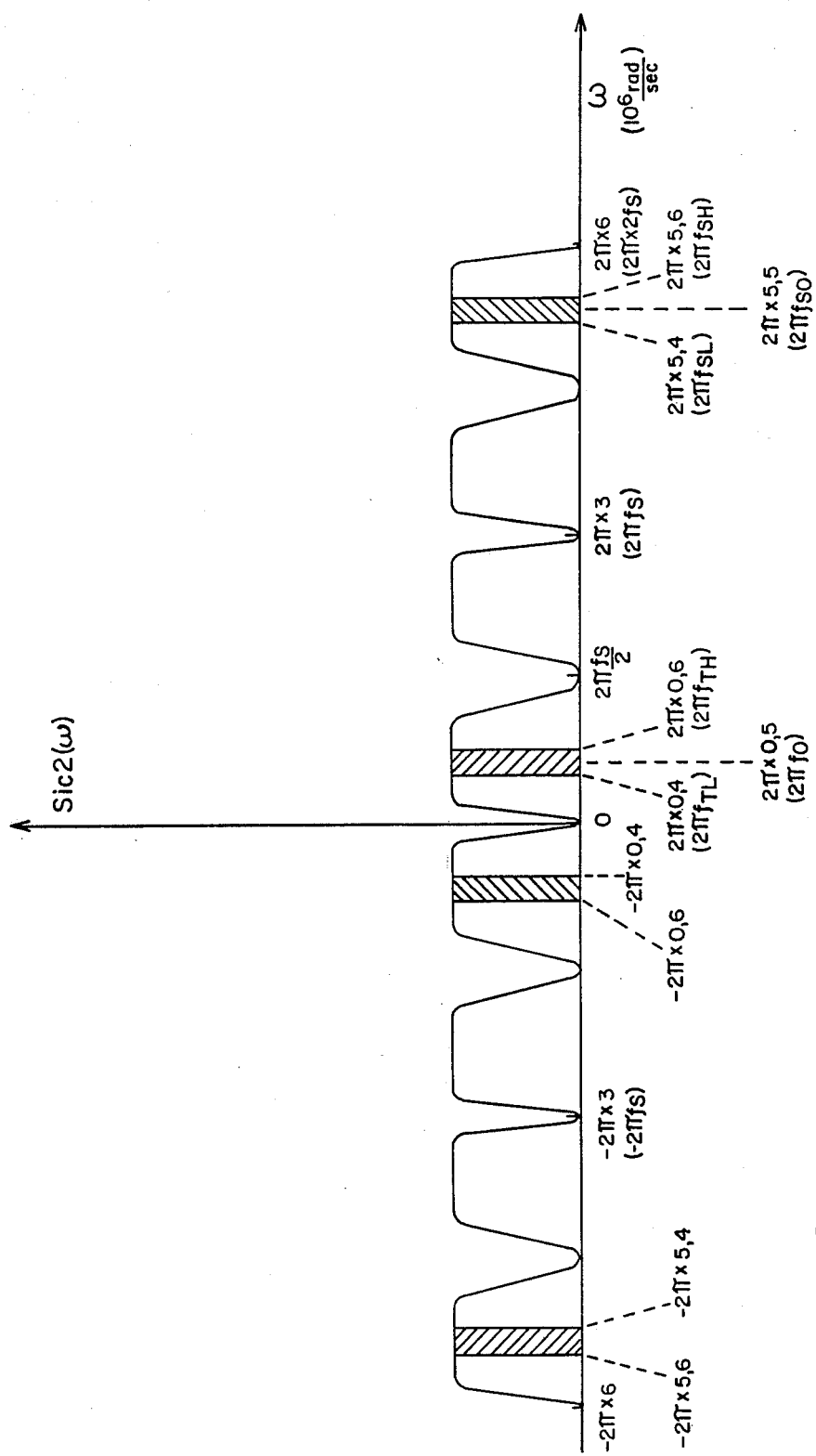
FIG. 4 is a graph of the spectrum of a further signal obtained from the signal of FIG. 2, in an intermediate point of the filter device of FIG. 1.

Again supposing an ideal sampling, the spectrum $S'_{ic2}(\omega)$ of the output signal of the first sub-block is obtained from formula (1). Its appearance, in the frequency interval comprised between $-6$ MHz and 6 MHz, is illustrated in FIG. 4. Also in this case, there is, at low frequency, a spectral component identical, except for mirror symmetry, to the spectrum of the original time-continuous signal. The components of interest of the input signal $s_i(t)$, as indicated by shading, are thus also in the band comprised between 400 and 600 kHz.

The second sub-block in which the block FIL has been ideally divided, having the band 400–600 kHz as pass-band, allows the unattenuated passage, as in the preceding case, of exactly the desired spectral components, while it attenuates as required the other components.

Also in this case, moreover, the block FIL also provides the shift of the spectral components of the filtered signal to a lower range of frequencies.

For the filtering according to this method to yield correct results, it is necessary that the sampling process be such as to provide on the base band a spectrum exactly identical (except for mirror symmetry) to the one of the time-continuous input signal $s'_i(t)$, at least with respect to the band of frequencies of interest. The spectrum of the time-continuous signal and the sampling frequency $f_s$, that is, must be such as to prevent the shifting of the spectral components of $S'_i(\omega)$ from determining an overlap between different spectral components in the range of frequencies of interest at low frequency (400–600 kHz).

The spectrum of the input signal $S'_i(\omega)$ must thus be limited in frequency, both upwardly and downwardly. If there is no certainty that such a limitation occurs in the input signal $s_i(t)$, it is convenient to place before the block FIL a time-continuous filter CTF which performs such a limitation. The requirements of such a filter depend on the characteristics of the input signal on the sampling frequency and on the band of interest of the signal which it is desired to allow to pass without attenuation through the overall filtering system, and can be determined and embodied according to methods known to the expert in the field.

A reasoning similar to the one made above for the case in which equation (5) is valid can be repeated by selecting as sampling frequency $f_s$ such a frequency that:

$$nf_s = f_0 + f_{sO} \tag{6}$$

where n is a positive whole number.

By increasing the value of n, a decrease in the value of the sampling frequency $f_s$ is achieved but the requirements of limitation of the band of the time-continuous signal at the input to the sampled-data filter FIL, $s'_i(t)$, become more stringent, and thus, generally, so do the specifications of the time-continuous filter CTF.

Preferred examples of the invention have been described, but naturally these are susceptible to modifications and variations within the scope of the inventive concept.

We claim:

1. A signal processing system comprising, in combination:
   a sampled-data band-pass filter means connected to receive an unattenuated input signal at a frequency included within an interval comprised between a first frequency (fsL) and a second frequency (fsH), which encompass a third frequency (fsO); said sampled-data band-pass filter means including a sampler means operating at a sampling frequency (fs) and band-pass means, said sampler means automatically performing a low-frequency shift of said unattenuated input signal which emcompasses a fourth frequency (f0), wherein said sampling frequency is equal to a whole submultiple of the sum of said third frequency (fsO) and said fourth frequency (f0), said band-pass means having, as its lower cutoff frequency, the difference between the sampling frequency and the second frequency (fs−fsH) and as its upper cutoff frequency the difference between the sampling frequency and the first frequency (fs−fsL).

2. A signal processing system according to claim 1, including an antialiasing time continuous filter means connected at the input of said sampled-data band-pass filter means allowing the substantially unattenuated passage of the components of said input signal at a frequency included within an interval comprised between said first frequency (fsL) and said second frequency (fsH), and substantially attenuating the components of said input signal at frequencies outside said interval.

3. A signal processing system according to claim 2, wherein said sampling frequency (fs) is equal to said sum of said third frequency (fsO) and said fourth frequency (f0).

4. A signal processing system according to claim 2, comprising in addition a smoothing filter means at the output of said sampled data band-pass filter which serves to provide a time continuous output signal at the output of the system.

5. The signal processing system of claim 2 wherein the antialiasing time continuous filter is a band-pass filter means providing both low-pass and high-pass filtering of the unattenuated input signal between the frequencies fs/2 and fs.

* * * * *